United States Patent
Song et al.

(10) Patent No.: US 7,138,314 B2
(45) Date of Patent: Nov. 21, 2006

(54) METHOD OF MANUFACTURING FLASH MEMORY DEVICE

(75) Inventors: Pil Geun Song, Seoul (KR); Sang Wook Park, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 81 days.

(21) Appl. No.: 11/014,570

(22) Filed: Dec. 16, 2004

(65) Prior Publication Data

US 2006/0008993 A1 Jan. 12, 2006

(30) Foreign Application Priority Data

Jul. 12, 2004 (KR) ...................... 10-2004-0054061

(51) Int. Cl.
*H01L 21/336* (2006.01)

(52) U.S. Cl. ...................................... 438/258; 438/756

(58) Field of Classification Search ................ 438/258, 438/689, 693, 723, 756, 757
See application file for complete search history.

(56) References Cited

U.S. PATENT DOCUMENTS 6,815,292 B1 * 11/2004 Fang et al. .................. 438/264
6,939,810 B1 * 9/2005 Sawamura .................. 438/723

* cited by examiner

*Primary Examiner*—Phuc T. Dang
(74) *Attorney, Agent, or Firm*—Marshall, Gerstein & Borun LLP

(57) ABSTRACT

Disclosed is a method of manufacturing a flash memory device using a STI process. Isolation films of a projection structure becomes isolation films of a nipple structure by means of a slant ion implant process and a wet etching process. A polysilicon layer is removed until the tops of the isolation films through two step processes of a CMP process and an etch-back process, thus forming floating gates and gates of high voltage and low voltage transistors of a cell. As such, as the isolation films of the nipple structure and the floating gates are formed at the same time, it is possible secure the overlay margin between an active region and the floating gates regardless of the shrinkage of the flash memory device. Also, moats can be prevented from being generated at the boundary between the active regions when the isolation films of the nipple structure are formed. Further, when the floating gates and the gates of the high voltage and low voltage transistors are formed, a dishing phenomenon and an erosion phenomenon can be prevented.

29 Claims, 5 Drawing Sheets

METHOD OF MANUFACTURING FLASH MEMORY DEVICE

BACKGROUND

1. Field of the Invention

The present invention relates to a method of manufacturing a flash memory device, and more specifically, to a method of manufacturing a flash memory device in which the size of the flash memory device can shrink while improving reliability of the flash memory device through a shallow trench isolation (hereinafter, referred to as 'STI') process.

2. Discussion of Related Art

Generally, a flash memory device is a stack gate structure consisting of a floating gate and a control gate. In the floating gate, since the active region must be covered, the overlay margin between the active region and the floating gate is an important factor. As the flash memory device gradually shrinks, however, it is difficult to secure the overlay margin between the active region and the floating gate through an existing STI process and an existing floating gate mask process. It is also difficult to obtain the overlay margin uniformity across the entire wafer.

Further, the flash memory device is formed typically by means of a wet etching process when a trench type isolation film is formed by a STI process. If the wet etching process is performed excessively, moats are generated at the boundary between the trench type isolation film and the active region. This makes a subsequent process difficult. Although an etch target of the wet etching process is properly set in order to solve this problem, it is difficult to obtain a uniform isolation film not having moats across the entire wafer.

As such, there is a limit to the shrinkage of the flash memory device due to securing of the overlay margin between the active region and the floating gate and the moats generated at the boundary between the isolation film and the active region.

SUMMARY OF THE INVENTION

Accordingly, the present invention has been made in view of the above problems, and it is an object of the present invention to provide a method of manufacturing a flash memory device in which an overlay margin between an active region and a floating gate is secured, the overlay margin uniformity is obtained across the entire wafer, and generation of moats at the boundary between an isolation film and the active region across the entire wafer is prevented, whereby reliability of the flash memory device is improved, processional stability of the flash memory device is secured and the size of the flash memory device can shrink.

To achieve the above object, according to an aspect of the present invention, there is provided a method of manufacturing a flash memory device, comprising the steps of forming isolation films of a projection structure in a semiconductor substrate, performing a slant ion implant process to form an ion implant layer on the entire structure including the isolation films of the projection structure, removing the ion implant layer to make the isolation films of the projection structure into isolation films of a nipple structure, performing an oxidization process to form a tunnel oxide film, and forming floating gates of an isolation shape between the isolation films of the nipple structure.

In the above, the slant ion implant process is performed using one of inert gases such as argon ion ($Ar^+$), neon ion ($Ne^+$), helium ion ($He^+$), krypton ion ($Kr^+$), xenon ion ($Xe^+$) and radon ion ($Rn^+$) with a dopant dose of 2E16 atoms/cm$^3$ to 5E16 atoms/cm$^3$ at an energy level of 5 keV to 10 keV depending upon a dopant mass and at an ion implant angle of 3° to 7°.

The slant ion implant process is performed so that the ion implant layer is formed with a dopant profile having a depth of 50 Å to 300 Å at both sides of the isolation films of the projection structure.

The process of removing the ion implant layer is performed using a HF solution or a BOE solution.

The oxidization process is performed by performing at least one of a dry oxidization process, a wet oxidization process and a thermal oxidization process.

The floating gates are formed by the steps of forming a polysilicon layer so that spaces between the isolation films of the nipple structure are filled, performing a CMP process to polish the polysilicon layer, and performing an etch-back process to etch the polished polysilicon layer until the tops of the isolation films of the nipple structure are exposed. The CMP process is performed until the polysilicon layer remains in thickness of 500 Å to 800 Å on the isolation films of the nipple structure. The etch-back process includes the steps of performing an etch-back process under a first process condition in which an etch selective ratio of oxide and polysilicon is high until the tops of the isolation films of the nipple structure are exposed, and performing an etch-back process under a similar second process condition in which an etch selective ratio of oxide and polysilicon is about 0.9 to 1.1 so that the isolation films of the nipple structure and the polysilicon layer are recessed by some thickness at the same time.

The first process is performed in a plasma etching apparatus using one of $CF_4$, $NF_3$, $SF_6$ and $Cl_2$ based gas, or a mixed gas of them. The second process is performed in a plasma etching apparatus using one of $CF_4/O_2$ mixed gas, $NF_3/O_2$ mixed gas and $CF_4/NF_3/O_2$ mixed gas, so that the isolation films of the nipple structure and the polysilicon layer are removed to a thickness of 50 Å to 200 Å.

The method further comprises the step of, after the floating gates are formed, performing an oxide select etching process using a HF solution or a BOE solution to remove nipple portions of the isolation films of the nipple structure by some thickness.

Further, according to another aspect of the present invention, there is provided a method of manufacturing a flash memory device, comprising the steps of providing a semiconductor substrate in which a cell region, a high voltage transistor region and a low voltage transistor region are defined, forming an oxide film on the semiconductor substrate of the high voltage transistor region, and forming pad oxide films on the semiconductor substrate of the cell region and the low voltage transistor region, forming hard mask layers on the oxide film and the pad oxide film, etching the hard mask layers, the oxide film, the pad oxide film and the semiconductor substrate to form trenches in a field region, forming isolation films of a projection structure in the trenches, respectively, performing a slant ion implant process to form an ion implant layer on the entire structure including the isolation films of the projection structure, removing the ion implant layer to make the isolation films of the projection structure into isolation films of a nipple structures, wherein the pad oxide film is removed and the oxide film becomes thin by some thickness during the process of removing the ion implant layer, performing an oxidization process to form a tunnel oxide film and a low voltage gate oxide film, wherein during the oxidization process, the oxide film becomes thick and thus becomes a high voltage gate oxide film, and forming floating gates of an isolation shape between the isolation films of the nipple structures.

In the above, the oxide film is formed to a thickness of 400 Å to 900 Å which is 100 Å to 300 Å thicker than the thickens of the high voltage gate oxide film.

The pad oxide film is formed 50 Å to 100 Å in thickness.

The hard mask layers are formed using a series of nitride in thickness which is at least thicker than the thickness of the floating gates.

The isolation films of the projection structure are formed by the steps of forming an insulating film on the entire structure including the trenches, performing a chemical mechanical polishing (CMP) process to polish the insulating film until the tops of the hard mask layers are exposed, and removing the exposed hard mask layers. The insulating film is formed by depositing oxide through a high density plasma method. The CMP process includes the steps of performing a CMP process using a low selective slurry of $SiO_2$ whose pH is 9 to 11 until the insulating film remains 500 Å to 1000 Å from the hard mask layer, and performing a CMP process using a high selective slurry of $CEO_2$ whose pH is 7 to 8 until the tops of the hard mask layers are exposed.

In the above, the slant ion implant process is performed using one of inert gases such as argon ion ($Ar^+$), neon ion ($Ne^+$), helium ion ($He^+$), krypton ion ($Kr^+$), xenon ion ($Xe^+$) and radon ion ($Rn^+$) with a dopant dose of 2E16 atoms/cm$^3$ to 5E16 atoms/cm$^3$ at an energy level of 5 keV to 10 keV depending upon a dopant mass and at an ion implant angle of 3° to 7°.

The slant ion implant process is performed so that the ion implant layer is formed with a dopant profile having a depth of 50 Å to 300 Å at both sides of the isolation films of the projection structure.

The process of removing the ion implant layer is performed using a HF solution or a BOE solution.

The oxidization process is performed by performing at least one of a dry oxidization process, a wet oxidization process and a thermal oxidization process.

Through the oxidization process, the tunnel oxide film and the low voltage gate oxide film are formed to a thickness of 50 Å to 100 Å, and the high voltage gate oxide film is formed to a thickness of 300 Å to 600 Å.

The floating gates are formed by the steps of forming a polysilicon layer so that spaces between the isolation films of the nipple structure are filled, performing a CMP process to polish the polysilicon layer, and performing an etch-back process to etch the polished polysilicon layer until the tops of the isolation films of the nipple structure are exposed. The CMP process is performed until the polysilicon layer remains in thickness of 500 Å to 800 Å on the isolation films of the nipple structure. The etch-back process includes the steps of performing an etch-back process under a first process condition in which an etch selective ratio of oxide and polysilicon is high until the tops of the isolation films of the nipple structure are exposed, and performing an etch-back process under a similar second process condition in which an etch selective ratio of oxide and polysilicon is about 0.9 to 1.1 so that the isolation films of the nipple structure and the polysilicon layer are recessed by some thickness at the same time.

The first process is performed in a plasma etching apparatus using one of $CF_4$, $NF_3$, $SF_6$ and $Cl_2$ based gas, or a mixed gas of them. The second process is performed in a plasma etching apparatus using one of $CF_4/O_2$ mixed gas, $NF_3/O_2$ mixed gas and $CF_4/NF_3/O_2$ mixed gas, so that the isolation films of the nipple structure and the polysilicon layer are removed to a thickness of 50 Å to 200 Å.

The method further comprises the step of, after the floating gates are formed, performing an oxide select etching process using a HF solution or a BOE solution to remove nipple portions of the isolation films of the nipple structure by some thickness.

DETAILED DESCRIPTION OF PREFERRED EMBODIMENTS

Figure 1:
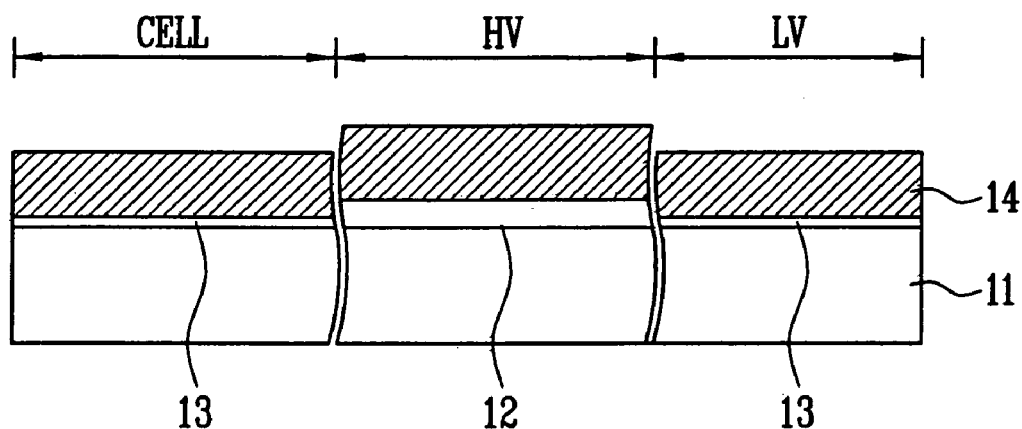
FIGS. 1 to 10 are cross-sectional views for explaining a method of manufacturing a floating gate of a flash memory device according to an embodiment of the present invention.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Further, in the drawing, the thickness and size of each layer are exaggerated for convenience of explanation and clarity. Like reference numerals are used to identify the same or similar parts.

FIGS. 1 to 10 are cross-sectional views for explaining a method of manufacturing a floating gate of a flash memory device according to an embodiment of the present invention.

Referring to FIG. 1, a semiconductor substrate 11 in which a cell region CELL, a high voltage transistor region HV and a low voltage transistor region LV are defined and on which a well formation ion implant process and a threshold voltage ion implant process are performed is provided. An oxide film 12 is formed on the semiconductor substrate 11 of the high voltage transistor region HV, and pad oxide films 13 are formed on the semiconductor substrate 11 of the cell region CELL and the low voltage transistor region LV. Hard mask layers 14 are formed on the oxide film 12 and the pad oxide film 13.

In the above, the oxide film 12 is a film that will be used as a gate oxide film of a high voltage transistor and has a thickness of approximately 100 Å to 300 Å which is thicker than that of a gate oxide film that will be formed finally. In the flash memory device, if the gate oxide film of the high voltage transistor is formed to a thickness of 300 Å to 600 Å, the oxide film 12 is formed 400 Å to 900 Å in thickness. The reason why the oxide film 12 is formed thicker than the final gate oxide film is that some of the oxide film 12 is lost in a wet etching process for forming an isolation film of a nipple structure, which is a subsequent process to be describer later, and some of the oxide film 12 is added when a tunnel oxide film is formed. For example, in the case where a thickness of about 200 Å is lost during the wet etching process and a thickness of about 50 Å is added when the tunnel oxide film is formed, the oxide film 12 is formed about 150 Å thicker than the thickness of the final gate oxide film.

The pad oxide film 13 is formed to a thickness of 50 to 100 Å. The hard mask layer 14 is formed using a series of nitride and plays an important role to decide the height of the floating gate. Accordingly, it is required that the hard mask layer 14 be formed at least thicker than the thickness of the floating gate.

Figure 2:
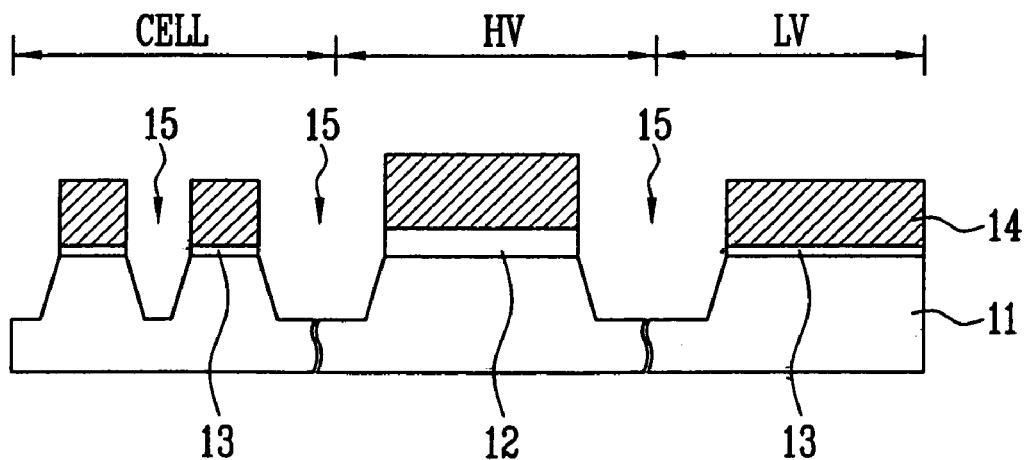

Referring to FIG. 2, a STI mask process and an etching process are performed to etch the hard mask layer 14, the oxide film 12, the pad oxide film 13 and the semiconductor substrate 11, thereby forming trenches 15 in a field region.

Figure 3:
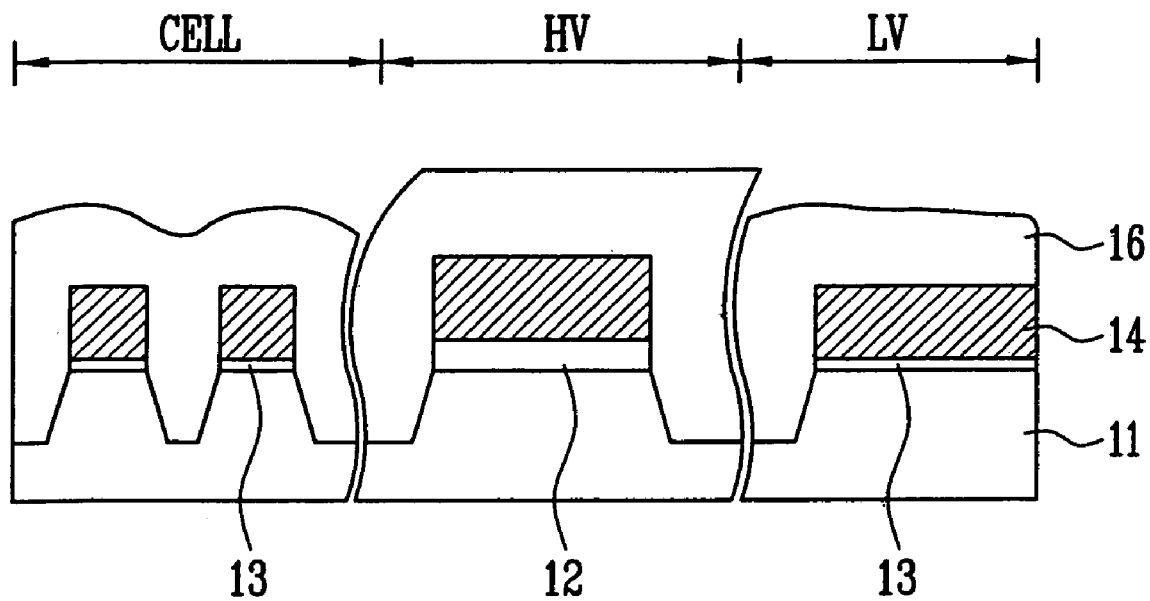

Referring to FIG. 3, a wall oxidation process and a liner deposition process are performed (it is to be noted that layers formed by these processes are not shown) and an insulating film 16 is formed to fully bury the trenches 15. The insulating film 16 can be formed by depositing oxide through a high density plasma (HDP) method or a variety of deposition methods.

Figure 4:
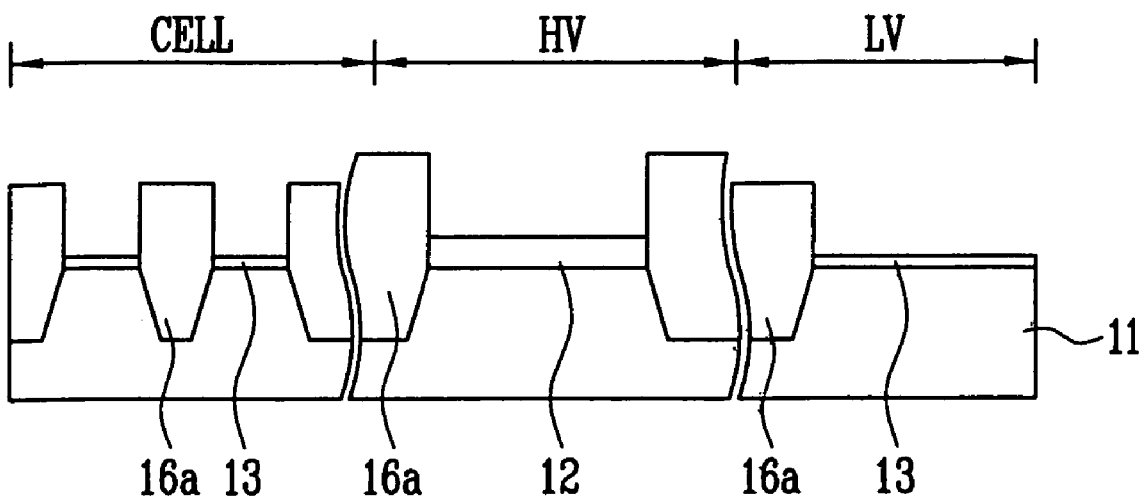

Referring to FIG. 4, the insulating film 16 is polished until the top of the hard mask layer 14 is exposed by means of a first chemical mechanical polishing (hereinafter, referred to as 'CMP') process. The exposed hard mask layer 14 is then removed. Accordingly, the insulating film 16 remains within the trenches 15, so that isolation films 16a of a projection structure are formed in an isolated shape.

In the above, the first CMP process is performed in two steps so that the insulating film 16 is uniformly polished across the entire wafer. The first polishing process is carried out using a low selective slurry (LSS) of $SiO_2$ whose pH is 9 to 11 until the insulating film 16 remains 500 Å to 1000 Å from the hard mask layer 14. The second polishing process is performed using a high selective slurry (HSS) of $CEO_2$ whose pH is 7 to 8 until the top of the hard mask layer 14 is exposed.

Figure 5:
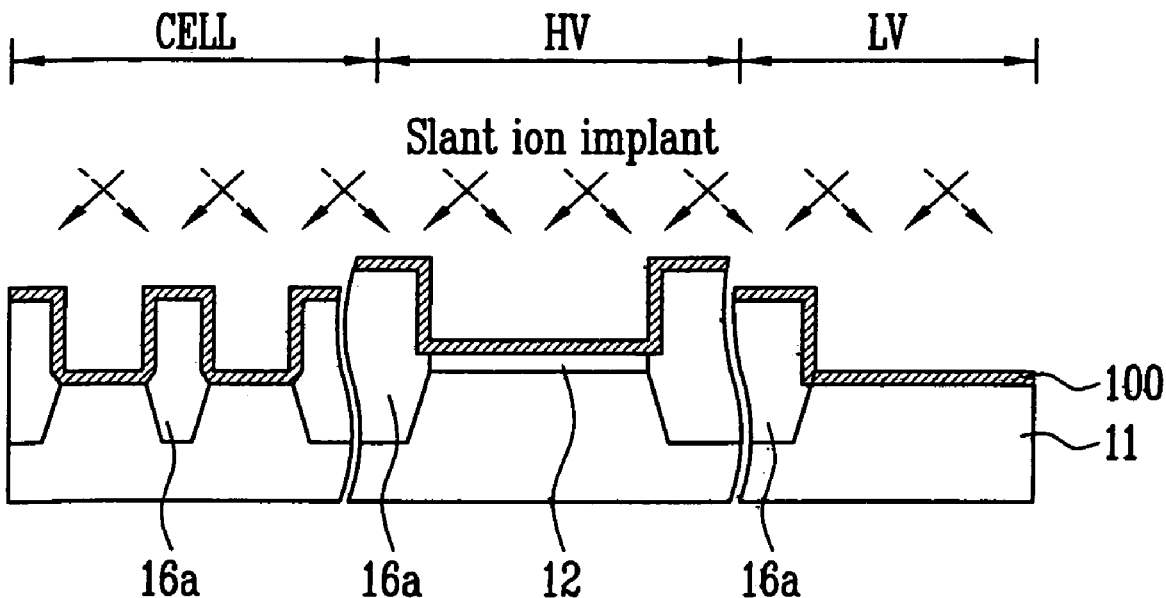

Referring to FIG. 5, ions are infiltrated into the surface of the oxide film 12, the pad oxide film 13 and the isolation films 16a of the projection structure by means of a slant ion implant process, so that an ion implant layer 100 is formed.

In the above, the slant ion implant process can be performed using inert gases such as argon ion ($Ar^+$), neon ion ($Ne^+$), helium ion ($He^+$), krypton ion ($Kr^+$), xenon ion ($Xe^+$) and radon ion ($Rn^+$) with a high dopant dose of 2E16 atoms/$cm^3$ to 5E16 atoms/$cm^3$ at a low energy level of 5 keV to 10 keV depending upon a dopant mass and at an ion implant angle of 3° to 7°. Through the slant ion implant process, the ion implant layer 100 is formed with a dopant profile of 50 Å to 300 Å in depth at both sides of the isolation films 16a of the projection structure.

Through the aforementioned slant ion implant process, the ion implant layer 100 having a thickness of 50 Å to 300 Å is formed at both sides of the isolation films 16a of the projection structure. The ion implant layer 100 having the similar thickness as both sides of the isolation films 16 of the projection structure is formed on the top of the isolation films 16a of the projection structure since the top of the isolation films 16a is not influenced by an ion implant angle. Also, the ion implant layer 100 having the similar thickness as both sides of the isolation films 16a of the projection structure is formed on the oxide film 12 since the space of the high voltage transistor region HV is formed at a wide portion and is thus not influenced by the ion implant angle. Meanwhile, the pad oxide film 13 formed at a portion where the space of the cell region CELL is narrow and the pad oxide film 13 formed at the portion where the space of the low voltage transistor region LV is wide are influenced during the ion implant since they are relatively thin as mentioned with reference to FIG. 1. Thus, most of the pad oxide film 13 becomes the ion implant layer 100.

Figure 6:
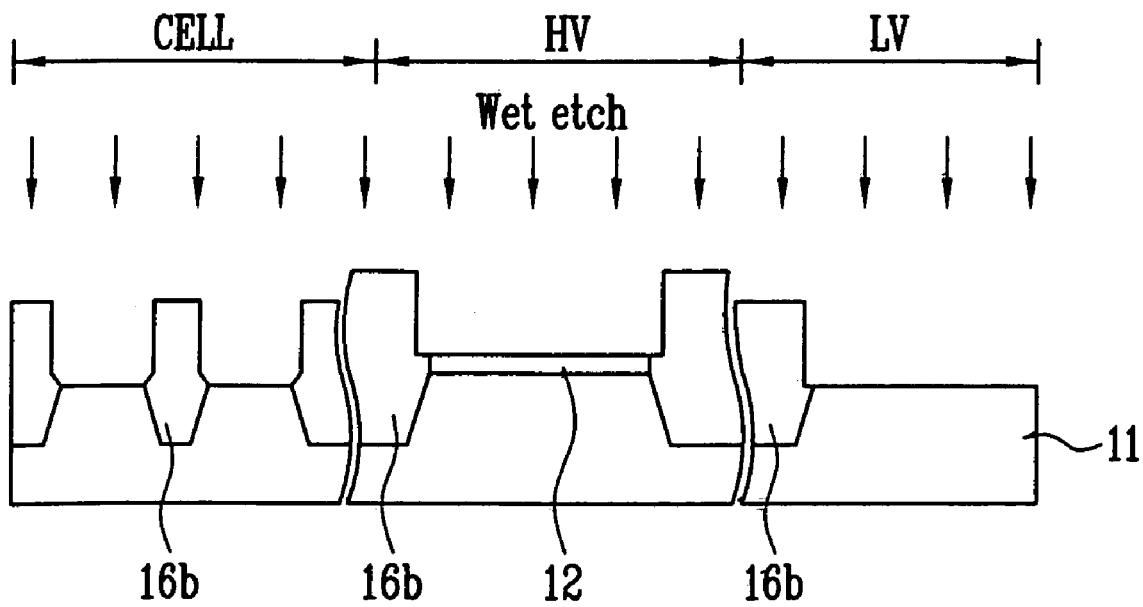

Referring to FIG. 6, since the ion implant layer 100 is removed by the wet etching process, the isolation films 16a of the projection structure become the isolation films 16b of a nipple structure in which the overlay margin between the active region and the floating gate is secured. In the cell region CELL and the low voltage transistor region LV, the semiconductor substrate 11 is exposed. The oxide film 12 of the high voltage transistor region HV becomes thin as much as the thickness of the ion implant layer 100.

In the above, the wet etching process is performed as a wet etch target in which the ion implant layer 100 is removed using a HF solution or a BOE solution. The ion implant layer 100 has properties that it has a fast etch rate compared to a layer into which ions are not implanted. Accordingly, as a wet etching process time can shorten, moats are prevented from being generated at the boundary between the isolation films 16b of the nipple structure and the active region across the entire wafer. Further, the isolation films 16a of the projection structure become the isolation films 16b of the nipple structure from which the ion implant layer 100 is removed during the wet etching process. It is therefore possible to obtain a uniform overlay margin between the active region and the floating gate across the entire wafer. If the wet etching process is carried out with the ion implant layer 100 not formed, it is difficult to obtain a uniform isolation film not having moats across the entire wafer although an etch target of the wet etching process is properly set. It also becomes difficult to accomplish the overlay margin uniformity between the active region and the floating gate.

Figure 7:
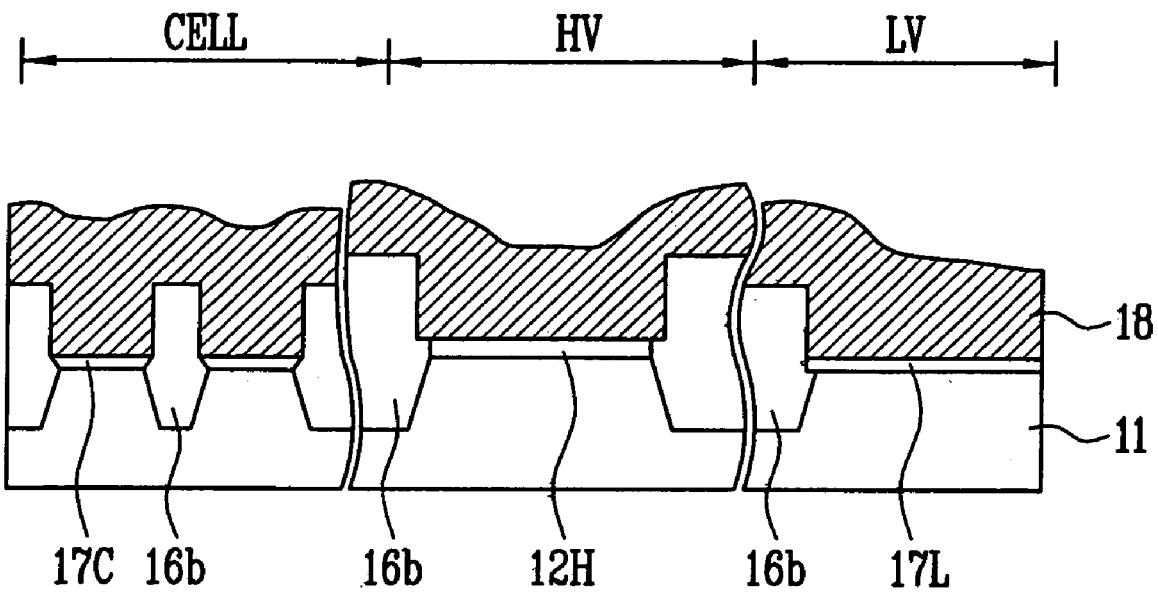

Referring to FIG. 7, an oxidization process is performed to form a tunnel oxide film 17C on the exposed semiconductor substrate 11 of the cell region CELL and a low voltage gate oxide film 17L on the exposed semiconductor substrate 11 of the low voltage transistor region LV at the same time. During the oxidization process, the oxide film 12 of the high voltage transistor region HV becomes thick by some degree and becomes thus a high voltage gate oxide film 12H of a thickness that is desired by a device. A polysilicon layer 18 is formed so that spaces between the isolation films 16b of the nipple structure are filled.

In the above, the oxidization process can be performed by using at least any one of a dry oxidization process, a wet oxidization process and a thermal oxidization process. The tunnel oxide film 17C and the low voltage gate oxide film 17L are formed to a thickness of 50 Å to 100 Å by means of the oxidization process. The high voltage gate oxide film 12H becomes thick as much as the same thickness as a deposition target of the oxidization process or becomes thick as much as a thickness thinner than a deposition target of the oxidization process depending upon an oxidization method. Thereby, the high voltage gate oxide film 12H is formed 300 Å to 600 Å in thickness.

Figure 8:
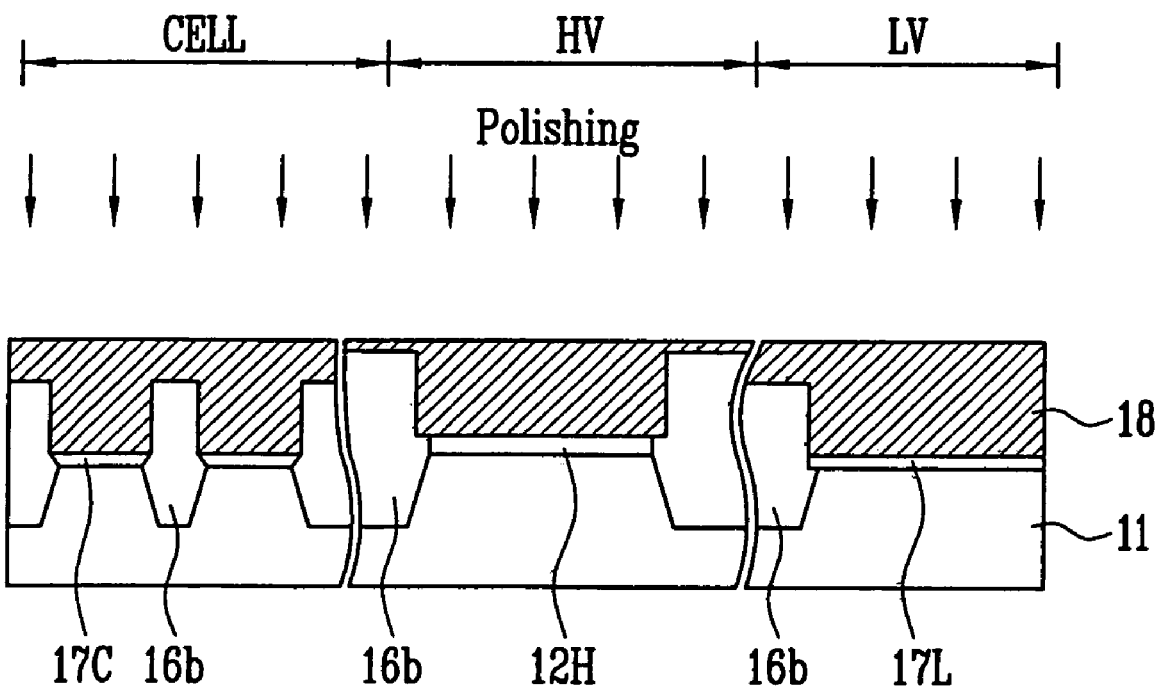

Referring to FIG. 8, the polysilicon layer 18 is polished by a second CMP process until the polysilicon layer 18 of a given thickness, e.g., 500 Å to 800 Å remains on the isolation films 16b of the nipple structure.

Figure 9:
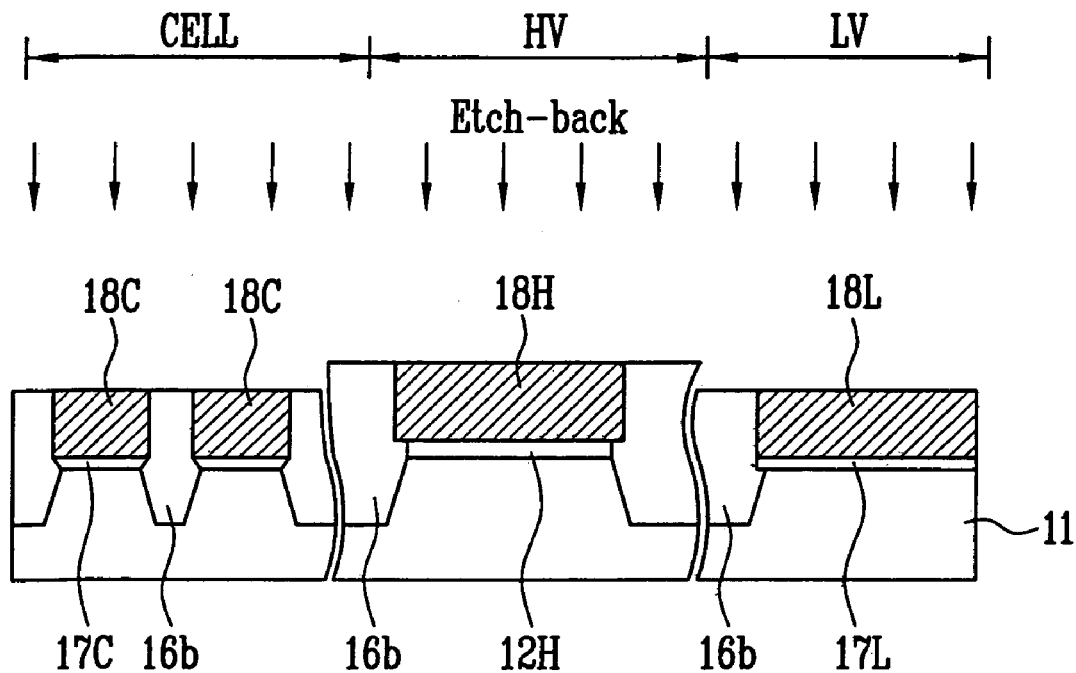

Referring to FIG. 9, an etch-back process is carried out to remove the polysilicon layers 18 remaining on the isolation films 16b of the nipple structure. Due to this, floating gates 18C that are isolated by the isolation films 16b of the nipple structure are formed in the cell region CELL. A high voltage gate 18H is formed in the high voltage transistor region HV. A low voltage gate 18L is formed in the low voltage transistor region LV. In the above, the high voltage gate 18H and the low voltage gate 18L define portions that will be used as the gate electrode of the high voltage transistor and the gate electrode of the low voltage transistor, respectively. Actual gates will be formed by patterning through a subsequent gate formation process.

In the above, in order to fully isolate the floating gates 18C without an erosion phenomenon of the isolation films 16b of the nipple structure and to prevent a dishing phenomenon of the high voltage gate 18H and the low voltage gate 18L from occurring, the etch-back process is performed in two steps. The first step process is performed under a process condition in which the etch selective ratio of oxide and polysilicon is high. The first step process is carried out in a plasma etching apparatus using one of a $CF_4$ gas, a $NF_3$ gas, a $SF_6$ gas and a $Cl_2$ based gas, or a mixed gas of them until the tops of the isolation films 16b of the nipple structure are exposed. The second step process is performed under a similar process condition in which the etch selective ratio of oxide and polysilicon is approximately 0.9 to 1.1. The second step process is carried out in a plasma etching apparatus using one of a $CF_4/O_2$ mixed gas, a $NF_3/O_2$ mixed gas and a $CF_4/NF_3/O_2$ mixed gas so that the isolation films 16b of the nipple structure and the polysilicon layer 18 are recessed at the same time in thickness of below 200 Å, preferably 50 to 200 Å.

Figure 10:
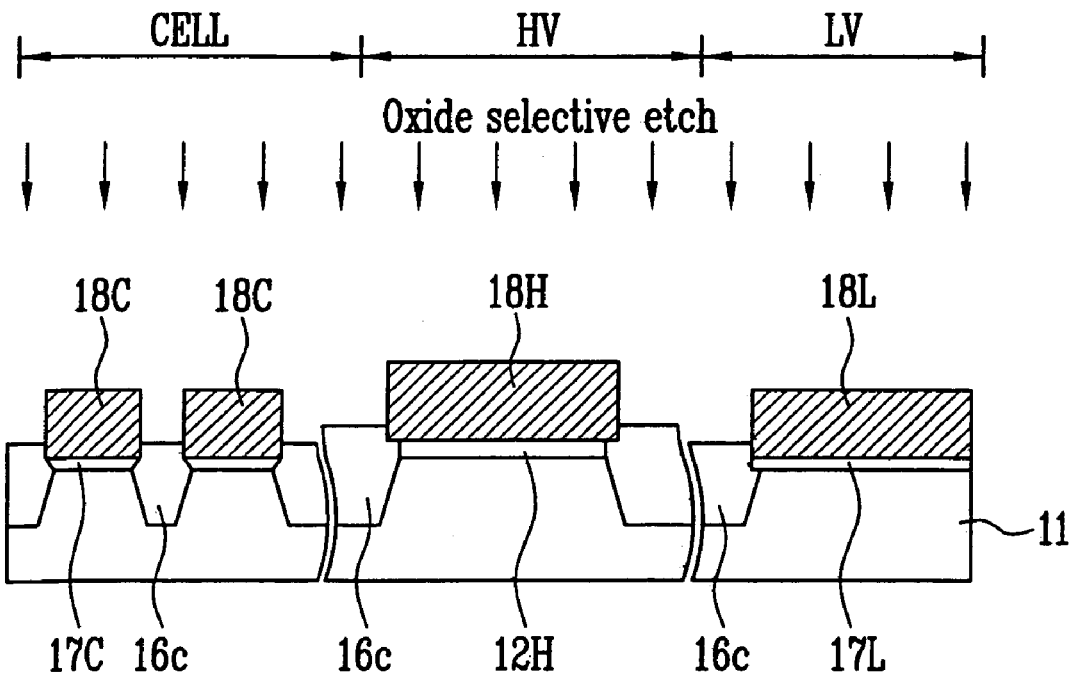

Referring to FIG. 10, in order to increase the coupling ratio of the device by exposing the side of the floating gate, the nipple portions of the isolation films 16b of the nipple structure are removed by means of an oxide select etching process using a HF solution or a BOE solution. Also, the coupling ratio can be controlled by adjusting a dipping time into an etch solution to control the oxide wet etch target. The etching process can be performed as an additional process step and can be replaced with a pre-cleaning process that is performed before a dielectric film formation process being a subsequent process is performed. In this time, the pre-cleaning process can be carried out in the same manner as the aforementioned etching process. An isolation films 16c are completed by the nipple portions of the isolation films 16b of the nipple structure are removed.

Thereafter, the flash memory device is completed through common processes such as a dielectric film formation process and a control gate formation process.

According to the present invention, as described above, an isolation film of a nipple structure and a floating gate are formed at the same time by means of a STI process. It is thus possible to secure the overlay margin between an active region and a floating gate regardless of the shrinkage of a flash memory device and also to omit additional floating gate mask process and etching process. Further, an isolation film of a nipple structure is formed through an ion implant layer formation process and a wet etching process. Moats can be thus prevented from being generated at the boundary between active regions. Floating gates and gates of a high voltage transistor and a low voltage transistor of a cell are formed by means of a polishing process and an etch-back process. Therefore, a dishing phenomenon and an erosion phenomenon can be prevented.

What is claimed is:

1. A method of manufacturing a flash memory device, comprising the steps of:
   forming isolation films of a projection structure in a semiconductor substrate;
   forming an ion implant layer on the entire structure including the isolation films by performing a slant ion implant process;
   removing the ion implant layer to make the isolation films having a nipple structure;
   performing an oxidization process to form a tunnel oxide film; and
   forming floating gates of an isolation shape between the isolation films of the nipple structure.

2. The method as claimed in claim 1, comprising performing the slant ion implant process using one of inert gases selected from the group consisting of argon ion ($Ar^+$), neon ion ($Ne^+$), helium ion ($He^+$), krypton ion ($Kr^+$), xenon ion ($Xe^+$) and radon ion ($Rn^+$) with a dopant dose of 2E16 atoms/cm$^3$ to 5E16 atoms/cm$^3$ at an energy level of 5 keV to 10 keV depending upon a dopant mass and at an ion implant angle of 3° to 7°.

3. The method as claimed in claim 1, comprising performing the slant ion implant process so that the ion implant layer is formed with a dopant profile having a depth of 50 Å to 300 Å at both sides of the isolation films of the projection structure.

4. The method as claimed in claim 1, comprising performing the process of removing the ion implant layer using a HF solution or a BOE solution.

5. The method as claimed in claim 1, comprising performing the oxidization process by performing at least one of a dry oxidization process, a wet oxidization process and a thermal oxidization process.

6. The method as claimed in claim 1, comprising forming the floating gates by the steps of:
   forming a polysilicon layer so that spaces between the isolation films of the nipple structure are filled;
   performing a chemical mechanical polishing process to polish the polysilicon layer; and
   performing an etch-back process to etch the polished polysilicon layer until the tops of the isolation films of the nipple structure are exposed.

7. The method as claimed in claim 6, comprising performing the CMP process until the polysilicon layer remains in thickness of 500 Å to 800 Å on the isolation films of the nipple structure.

8. The method as claimed in claim 6, wherein the etch-back process includes the steps of:
   performing an etch-back process under a first process condition in which an etch selective ratio of oxide and polysilicon is high until the tops of the isolation films of the nipple structure are exposed; and
   performing an etch-back process under a similar second process condition in which an etch selective ratio of oxide and polysilicon is about 0.9 to 1.1 so that the isolation films of the nipple structure and the polysilicon layer are recessed by some thickness at the same time.

9. The method as claimed in claim 8, comprising performing the first process in a plasma etching apparatus using one of $CF_4$, $NF_3$, $SF_6$ and $Cl_2$ based gas, or a mixture thereof.

10. The method as claimed in claim 8, comprising performing the second process in a plasma etching apparatus using one of $CF_4/O_2$ mixed gas, $NF_3/O_2$ mixed gas and $CF_4/NF_3/O_2$ mixed gas, to remove the isolation films of the nipple structure and the polysilicon layer to a thickness of 50 Å to 200 Å.

11. The method as claimed in claim 1, further comprising the step of, after forming the floating gates, performing an oxide select etching process using a HF solution or a BOE solution to remove nipple portions of the isolation films of the nipple structure by some thickness.

12. A method of manufacturing a flash memory device, comprising the steps of:
   providing a semiconductor substrate in which a cell region, a high voltage transistor region and a low voltage transistor region are defined;
   forming an oxide film on the semiconductor substrate of the high voltage transistor region, and forming pad oxide films on the semiconductor substrate of the cell region and the low voltage transistor region;
   forming hard mask layers on the oxide film and the pad oxide film;

etching the hard mask layers, the oxide film, the pad oxide film and the semiconductor substrate to form trenches in a field region;

forming isolation films of a projection structure in the trenches, respectively;

forming an ion implant layer on the entire structure including the isolation films by performing a slant ion implant process;

removing the ion implant layer to make the isolation films having a nipple structures, wherein the pad oxide film is removed and the oxide film becomes thin by some thickness during the process of removing the ion implant layer;

performing an oxidization process to form a tunnel oxide film and a low voltage gate oxide film, wherein during the oxidization process, the oxide film becomes thick and thus becomes a high voltage gate oxide film; and forming floating gates of an isolation shape between the isolation films of the nipple structures.

13. The method as claimed in claim 12, comprising forming the oxide film to a thickness of 400 Å to 900 Å which is 100 Å to 300 Å thicker than the thickness of the high voltage gate oxide film.

14. The method as claimed in claim 12, comprising forming the pad oxide film 50 Å to 100 Å in thickness.

15. The method as claimed in claim 12, comprising forming the hard mask layers using a series of nitride in thickness which is at least thicker than the thickness of the floating gates.

16. The method as claimed in claim 12, comprising forming the isolation films of the projection structure by the steps of:

forming an insulating film on the entire structure including the trenches;

performing a chemical mechanical polishing (CMP) process to polish the insulating film until the tops of the hard mask layers are exposed; and removing the exposed hard mask layers.

17. The method as claimed in claim 16, comprising forming the insulating film by depositing oxide through a high density plasma method.

18. The method as claimed in claim 16, wherein the CMP process includes the steps of:

performing a CMP process using a low selective slurry of $SiO_2$ whose pH is 9 to 11 until the insulating film remains 500 Å to 1000 Å from the hard mask layer; and performing a CMP process using a high selective slurry of $CEO_2$ whose pH is 7 to 8 until the tops of the hard mask layers are exposed.

19. The method as claimed in claim 12, comprising performing the slant ion implant process using at least one inert gas selected from the group comprising argon ion ($Ar^+$), neon ion ($Ne^+$), helium ion ($He^+$), krypton ion ($Kr^+$), xenon ion ($Xe^+$) and radon ion ($Rn^+$) with a dopant dose of 2E16 atoms/$cm^3$ to 5E16 atoms/$cm^3$ at an energy level of 5 keV to 10 keV depending upon a dopant mass and at an ion implant angle of 3° to 7°.

20. The method as claimed in claim 12, comprising performing the slant ion implant process so that the ion implant layer is formed with a dopant profile having a depth of 50 Å to 300 Å at both sides of the isolation films of the projection structure.

21. The method as claimed in claim 12, comprising removing the ion implant layer is performed using a HF solution or a BOE solution.

22. The method as claimed in claim 12, comprising performing the oxidization process by performing at least one of a dry oxidization process, a wet oxidization process and a thermal oxidization process.

23. The method as claimed in claim 12, comprising forming the tunnel oxide film and the low voltage gate oxide film through the oxidation process to a thickness of 50 Å to 100 Å, and the high voltage gate oxide film is formed to a thickness of 300 Å to 600 Å.

24. The method as claimed in claim 12, comprising forming the floating gates by the steps of:

forming a polysilicon layer so that spaces between the isolation films of the nipple structure are filled;

performing a CMP process to polish the polysilicon layer; and performing an etch-back process to etch the polished polysilicon layer until the tops of the isolation films of the nipple structure are exposed.

25. The method as claimed in claim 24, comprising performing the CMP process until the polysilicon layer remains in thickness of 500 Å to 800 Å on the isolation films of the nipple structure.

26. The method as claimed in claim 24, wherein the etch-back process includes the steps of:

performing an etch-back process under a first process condition in which an etch selective ratio of oxide and polysilicon is high until the tops of the isolation films of the nipple structure are exposed; and performing an etch-back process under a similar second process condition in which an etch selective ratio of oxide and polysilicon is about 0.9 to 1.1 so that the isolation films of the nipple structure and the polysilicon layer are recessed by some thickness at the same time.

27. The method as claimed in claim 26, comprising performing the first process in a plasma etching apparatus using one of $CF_4$, $NE_3$, $SF_6$ and $Cl_2$ based gas, or a mixture thereof.

28. The method as claimed in claim 26, comprising performing the second process in a plasma etching apparatus using one of $CF_4/O_2$ mixed gas, $NF_3/O_2$ mixed gas and $CF_4/NF_3/O_2$ mixed gas, to remove the isolation films of the nipple structure and the polysilicon layer to a thickness of 50 Å to 200 Å.

29. The method as claimed in claim 12, further comprising the step of, after forming the floating gates, performing an oxide select etching process using a HF solution or a BOE solution to remove nipple portions of the isolation films of the nipple structure by some thickness.

* * * * *